United States Patent [19]

Pfister et al.

[11] Patent Number: 4,468,258

[45] Date of Patent: Aug. 28, 1984

[54] METHOD OF CONTROLLING THE PARTIAL PRESSURE OF AT LEAST ONE SUBSTANCE MIXTURE OR MIXTURE OF SUBSTANCES

[75] Inventors: Werner Pfister, Blaustein-Arnegg; Ewald Schlosser, Senden-Witzighausen, both of Fed. Rep. of Germany

[73] Assignee: Licentia Patent-Verwaltungs-GmbH, Frankfurt am Main, Fed. Rep. of Germany

[21] Appl. No.: 400,678

[22] Filed: Jul. 22, 1982

[30] Foreign Application Priority Data

Jul. 25, 1981 [DE] Fed. Rep. of Germany ....... 3129449

[51] Int. Cl.$^3$ .......................................... H01L 21/208
[52] U.S. Cl. .................................... 148/1.5; 148/171; 148/172; 148/173; 156/624
[58] Field of Search ................ 148/171, 172, 173, 1.5; 156/624, DIG. 89

[56] References Cited

U.S. PATENT DOCUMENTS

| | | | |
|---|---|---|---|
| 3,533,856 | 10/1970 | Panish et al. | 148/171 X |
| 3,664,294 | 5/1972 | Solomon | 148/171 X |
| 3,752,118 | 8/1973 | Solomon et al. | 148/171 X |
| 4,227,962 | 10/1980 | Antypas | 156/624 |

OTHER PUBLICATIONS

Panish et al., *J. of Crystal Growth*, vol. 11, 1971, pp. 101–103, 156–624.

Primary Examiner—G. Ozaki
Attorney, Agent, or Firm—Spencer & Frank

[57] ABSTRACT

A method of controlling the partial pressure of at least one substance or substance mixture comprising arranging the substance or mixture of substances in a chamber, arranging at least one element containing the substance or mixture of substances in the chamber and selecting the structure or crystal structure of the element to provide the desired partial pressure in the chamber.

9 Claims, 1 Drawing Figure

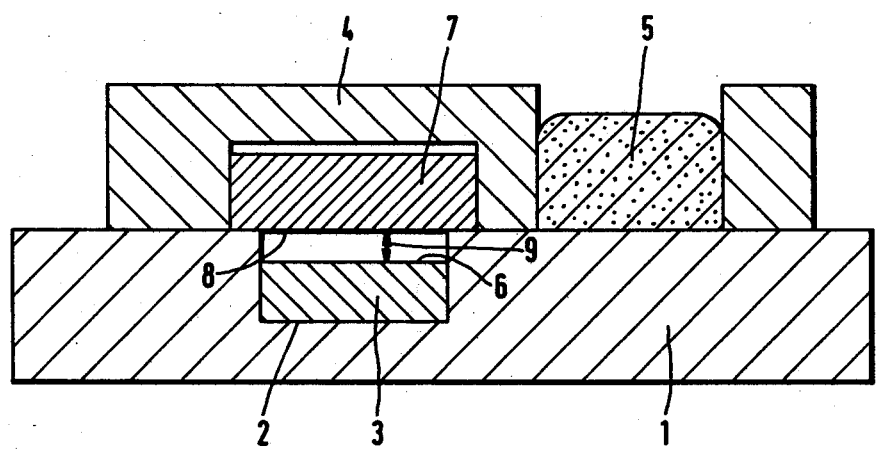

METHOD OF CONTROLLING THE PARTIAL PRESSURE OF AT LEAST ONE SUBSTANCE MIXTURE OR MIXTURE OF SUBSTANCES

BACKGROUND OF THE INVENTION

The invention relates to a method of controlling the partial pressure of at least one substance or mixture of substances in simultaneously liquid and solid phase.

The invention relates in particular to so called liquid phase epitaxy techniques which serve to produce semiconductor components.

In one such method, a so called epitaxy boat has a chamber wherein for example, there is a depression, which contains a subtance or mixture of substances in the form of a so called growth substrate. The growth substrate is covered by a displaceable lid during a heating phase necessary during manufacture, the lid having a so called epitaxial growth melt in a recess. After the heating phase the lid 4 is displaced such that the epitaxial growth melt is located above the growth substrate so that a doped semiconductor layer can grow for example.

This method has the disadvantage that a proportion of the substance or mixture of substances is vapourised during the heating phase such that the growth substrate is provided with a flawed surface. This thermal damage may produce faulty semiconductor components.

In order to avoid this thermal damage it was proposed that a recess should be arranged in the lid this recess accomodating a body for example a so called covering substrate which has a similar chemical composition to the epitaxial growth substrate. Thermal damage to the surface always recurs in a method of this type and makes it impossible to produce reliable semiconductor components for example.

SUMMARY OF THE INVENTION

It is an object of the invention to provide a method of controlling the partial pressure of a substance or mixture of substances which facilitates simple reliable and very accurate control such that more particularly a substance or mixture of substances in solid phase, is not subject to damage at its surface due to heat when there is thermal loading during manufacture.

According to a first aspect of the invention there is provided a method of controlling the partial pressure of at least one substance or mixture of substances comprising arranging said substance or mixture of substances in a chamber, arranging at least one element containing said substance or mixture of substances in said chamber and selecting its structure or crystal structure to provide the desired partial pressure in said chamber.

BRIEF DESCRIPTION OF THE DRAWINGS

The invention will now be described in greater detail by way of example, with reference to the drawing, the single FIGURE of which shows, schematically, one form of apparatus for use with the method of the invention.

DESCRIPTION OF THE PREFERRED EMBODIMENTS

The drawing shows an apparatus used in the previously described known method. Thus the drawing shows a so called epitaxy boat 1 with a chamber 2, for example a depression, which contains a substance or mixture of substances in the form of a so called growth substrate 3. The growth substrate 3 is covered by a displaceable lid 4 during a heating phase necessary during manufacture, the lid having a so called epitaxial growth melt 5 in a recess. After the heating phase the lid 4 is displaced such that the epitaxial growth melt 5 is located above the growth substrate 3 so that a doped semiconductor layer can grow for example.

This method has the disadvantage that a proportion of the substance or mixture of substances is vaporized during the heating phase such that the growth substrate 3 is provided with a flawed surface 6. This thermal damage produces faulty semiconductor components.

As mentioned previously, in order to avoid this thermal damage it was proposed that a recess should be arranged in the lid 4 said recess accomodating a body 7, for example a so called covering substrate which has a similar chemical composition to the epitaxial growth substrate. Thermal damage to the surface 6, which surface defines a phase boundary between substrate 3 and a gaseous medium in space 9, always recurs in a method of this type and makes it impossible to produce reliable semiconductor components for example.

The present invention is based on the knowledge that the partial pressure of the substance or mixture of substances does not only depend on the chemical composition of the body or its surroundings but to a very large extent on the structure and/or crystal structure of the body. Surprisingly it has been shown that with the same physical conditions a crystal formed from a substance or mixture of substances has a different partial pressure of the substance or mixture of substances at differently oriented crystal surfaces, for example (110)-surface or (111)-surface respectively. This effect is utilized for the method in accordance with the invention of which one embodiment is described hereafter.

An InP crystal, which forms the growth substrate 3, is used as the mixture of substances and the surface 6 is formed for example by an (100)-crystal surface. An InP crystal is also used for the body 7, the covering substrate and, is oriented such that its surface 8 which faces the surface 6 is formed by a (111)-B crystal surface. The two crystal surfaces are separated from each other spacially by means of a spacing 9. During the heating phase mentioned at the outset, which causes thermal loading, the volatile P(phosphorus) component of the InP only vaporized from the surface 8 since because of its crystal orientation it brings about a higher partial pressure of phosphorus at the temperatures used than is the case for the surface 6 which is to be protected. Taking further easily set conditions into account, for example size of the spacing 9, and the material and shape of the epitaxy boat 1, the partial pressure of the phosphorus is controlled during the heating phase such that thermal damage to the surface 6 is avoided.

It is an advantage of the above described embodiment that such a good quality of the surface of individual semiconductor layers is provided when manufacturing so called Group III–V semiconductor components such as InP, GaAs and GaP that subsequent processing steps designed to smooth away unevenness, for example by etching and/or initially dissolving the semiconductor layer, are superfluous.

The invention is not restricted to the example of embodiment described but can be used for any crystallizing substances or mixtures of substances in which differently oriented crystal surfaces cause a different partial pressure respectively of at least one chemical component of the substance or mixture of substances.

It will be understood that the above description of the present invention is susceptible to various modifications, changes and adaptations.

What is claimed is:

1. A method of controlling the partial pressure of at least one substance or a mixture of substances present in a substrate, in which at least one element which contains the substance or mixture of substances is arranged in a chamber which contains the substrate and its crystal structure is selected such that the desired partial pressure is formed in the said chamber.

2. A method as defined in claim 1 wherein one surface of said element is turned towards at least one phase boundary of the substrate with said surface having a substantially uniform crystal structure.

3. A method as defined in claim 1, wherein a partial pressure is produced by said element and/or its surface, and thermal damage to a surface of the substrate which is a phase boundary of the substrate with a gas is avoided.

4. A method as defined in claim 1, wherein said element and said substrate have essentially the same chemical composition and essentially the same crystal structure; and one surface of said element which is opposite to a surface of said substrate is selected such that its crystal orientation differs from that of said surface of said substrate.

5. A method as defined in claim 4 wherein the crystal orientation of said surface of said element and said surface of said substrate are selected so that the partial pressure in the region of said surface of said substrate is smaller than the partial pressure directly at said surface of said element.

6. A method as defined in claim 1, wherein any contact between a surface of said element and surface of said substrate is avoided, and a spacing is selected between said surface of said element and the surface of said substrate.

7. A method as defined in claim 1, wherein a III–V semiconductor in solid phase is selected for the said substrate and for said element, respectively, and has a volatile Group 5 component.

8. A method as defined in claim 7, wherein said semiconductor is selected from the group consisting of InP, GaAs and GaP, said surface of said element comprises a crystallographic (111)-B-surface, and said surface of said substrate comprises a crystal surface which differs from this crystal orientation.

9. A method of controlling the partial pressure of at least one substance or mixture of substances present in a substrate comprising arranging said substrate in a chamber, spacing apart therefrom at least one element containing said substance or mixture of substances in said chamber and selecting its crystal structure to provide the desired partial pressure in said chamber.

* * * * *